United States Patent
Jung

(10) Patent No.: US 9,659,608 B2
(45) Date of Patent: May 23, 2017

(54) SEMICONDUCTOR MEMORY APPARATUS, AND METHOD FOR TRAINING REFERENCE VOLTAGE

(71) Applicant: SK hynix Inc., Icheon-si, Gyeonggi-do (KR)

(72) Inventor: Young Mok Jung, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 15/017,835

(22) Filed: Feb. 8, 2016

(65) Prior Publication Data
US 2017/0092338 A1    Mar. 30, 2017

(30) Foreign Application Priority Data
Sep. 30, 2015 (KR) .......................... 10-2015-0137533

(51) Int. Cl.
*G11C 5/14* (2006.01)
*G11C 7/10* (2006.01)

(52) U.S. Cl.
CPC ...................... *G11C 7/10* (2013.01)

(58) Field of Classification Search
CPC ......... G11C 5/147; G11C 7/10; G11C 7/1039; G11C 11/4093

USPC ............................................. 365/189.09, 226
See application file for complete search history.

(56) References Cited

U.S. PATENT DOCUMENTS

| | | | |
|---|---|---|---|
| 2014/0029336 A1* | 1/2014 | Venkitachalam .. | G11C 16/0483 365/185.03 |
| 2014/0050030 A1* | 2/2014 | Grunzke .......... | H03K 19/01857 365/185.23 |
| 2016/0035411 A1* | 2/2016 | Yu ...................... | G11C 11/4091 365/189.07 |

FOREIGN PATENT DOCUMENTS

| KR | 1020080017444 A | 2/2008 |
|---|---|---|
| KR | 100915830 B1 | 8/2009 |

* cited by examiner

*Primary Examiner* — Han Yang
(74) *Attorney, Agent, or Firm* — William Park & Associates Ltd.

(57) ABSTRACT

A semiconductor memory apparatus may be configured to, in a data reference voltage training mode, set a reference pad reference voltage by training a first initial data reference voltage for a reference pad being any one of a plurality of input/output pads, and set a data reference voltage for each of remaining input/output pads by training a second initial data reference voltage being the reference pad reference voltage for each of the remaining input/output pads.

20 Claims, 4 Drawing Sheets

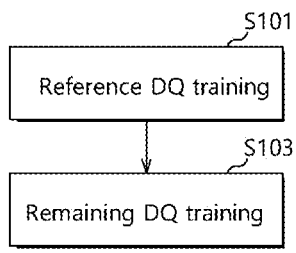
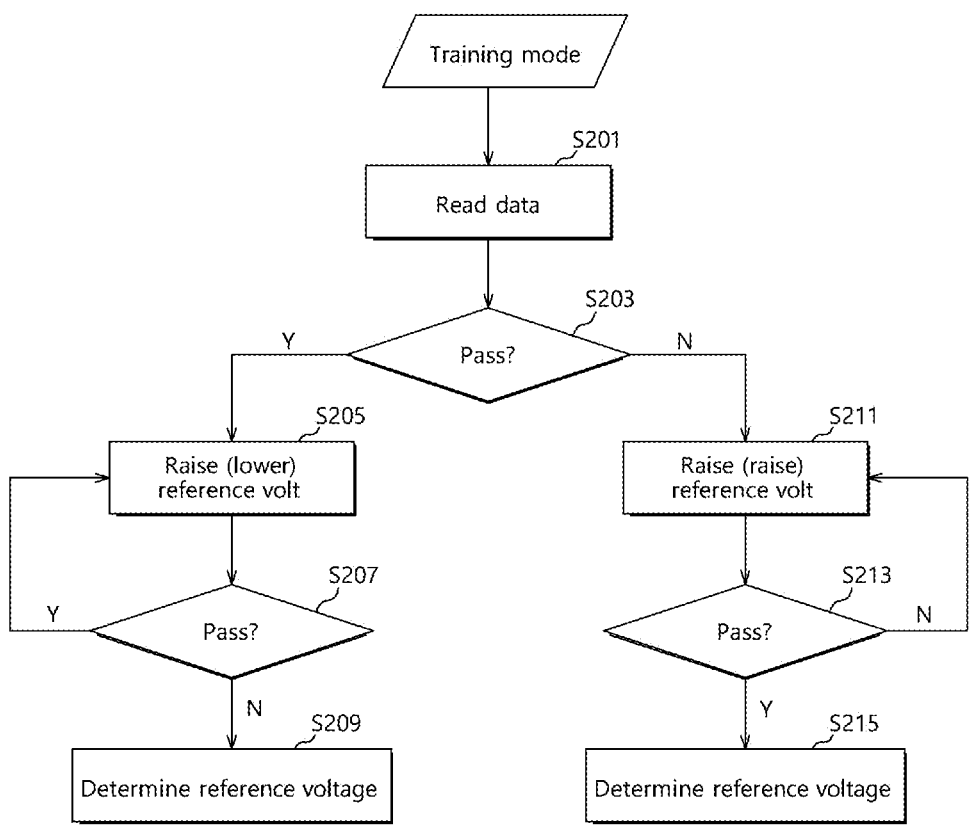

(54) SEMICONDUCTOR MEMORY APPARATUS, AND METHOD FOR TRAINING REFERENCE VOLTAGE

CROSS-REFERENCES TO RELATED APPLICATION

The present application claims priority under 35 U.S.C. §119(a) to Korean application number 10-2015-0137533, filed on Sep. 30, 2015, in the Korean Intellectual Property Office, which is incorporated herein by reference in its entirety.

BACKGROUND

1. Technical Field

Various embodiments generally relate to a semiconductor apparatus, and, more particularly, to a semiconductor memory apparatus and a method for training a reference voltage.

2. Related Art

A semiconductor apparatus uses various reference voltages to discriminate between logic levels of data or internal signals.

In general, a reference voltage may be set as an intermediate value between a potential defining a logic high level and a potential defining a logic low level.

Reference voltages serve as absolute voltages for determining logic levels of data or internal signals. Therefore, reference voltages should have levels capable of processing data or internal signals without an error.

Recently, in a semiconductor apparatus, a reference voltage training technique for setting the level of a reference voltage by finding, during a booting process, a level range of the reference voltage within which the semiconductor apparatus may normally operate is used.

In a semiconductor apparatus, a reference voltage to be used in discriminating the logic level of data may also be trained during a booting process. A data reference voltage determined through training may serve as a factor for determining the size of a valid data window.

SUMMARY

In an embodiment, a semiconductor memory apparatus may be configured to, in a data reference voltage training mode, set a reference pad reference voltage by training a first initial data reference voltage for a reference pad being any one of a plurality of input/output pads, and set a data reference voltage for each of remaining input/output pads by training a second initial data reference voltage being the reference pad reference voltage for each of the remaining input/output pads.

In an embodiment, a semiconductor memory apparatus may be provided. The semiconductor memory apparatus may include a controller configured to, in a training mode, generate a first data reference voltage adjustment signal for training a reference voltage for a reference pad being any one of a plurality of input/output pads, and generate a second data reference voltage adjustment signal for training a reference voltage for each of remaining input/output pads. The semiconductor memory apparatus may include a memory circuit configured to generate a reference pad reference voltage by changing a first initial data reference voltage in response to the first data reference voltage adjustment signal, and generate a data reference voltage for each of the remaining input/output pads by changing a second initial data reference voltage being the reference pad reference voltage in response to the second data reference voltage adjustment signal.

In an embodiment, a method for training a reference voltage of a semiconductor memory apparatus including a controller and a memory circuit may be provided. The method may include setting a reference pad reference voltage by training a first initial data reference voltage for a reference pad being any one of a plurality of input/output pads, in a data reference voltage training mode. The method may include setting a data reference voltage for each of remaining input/output pads by training a second initial data reference voltage being the reference pad reference voltage for each of the remaining input/output pads.

In an embodiment, a semiconductor memory apparatus may be provided. The semiconductor memory apparatus may include a controller configured to raise or lower a reference voltage based on a read result through a training target input/output pad, and provide a count signal and a count clock as data reference voltage adjustment signals. The semiconductor memory apparatus may include an interface circuit coupled to the controller. The interface circuit may include a control signal generator configured to generate control signals in response to the data reference voltage adjustment signals. The interface circuit may include a data input circuit configured to change a level of a data reference voltage in response to the control signals, determine a level of input data based on a changed data reference voltage, and provide a determination result.

BRIEF DESCRIPTION OF THE DRAWINGS

FIG. 5 is a representation of an example of a flow chart to assist in the explanation of a method for training a reference voltage in accordance with an embodiment.

FIG. 6 is a representation of an example of a flow chart to assist in the explanation of a method for training a reference voltage in accordance with an embodiment.

DETAILED DESCRIPTION

Hereinafter, a semiconductor memory apparatus and a method for training a reference voltage will be described below with reference to the accompanying drawings through various examples of embodiments.

Figure 1:
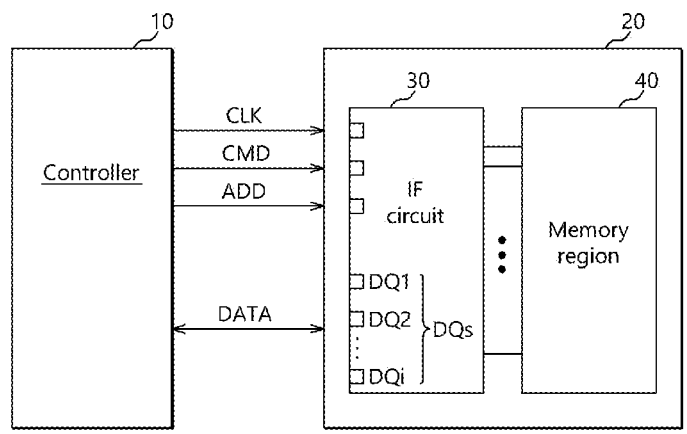
FIG. 1 is a configuration diagram illustrating a representation of an example of a semiconductor memory apparatus in accordance with an embodiment.

FIG. 1 is a configuration diagram illustrating a representation of an example of a semiconductor memory apparatus in accordance with an embodiment.

Referring to FIG. 1, a semiconductor memory apparatus 1 in accordance with an embodiment may include a controller 10 and a memory circuit 20.

The controller 10 may be configured to provide a clock signal CLK, a command CMD and an address ADD to the memory circuit 20, and transmit and receive data DATA to and from the memory circuit 20. The memory circuit 20 may be configured to comprise a plurality of input/output pads DQs (DQ1 through DQi).

The semiconductor memory apparatus 1 may train a data reference voltage at a predetermined timing. The data reference voltage may be a reference voltage which discriminates the logic level of the data DATA provided from the controller 10 to the memory circuit 20.

In an embodiment, the controller 10 writes training data in a preset region of the memory circuit 20, in a data reference voltage training mode. The controller 10 determines a pass or a fail, based on a training data read result through a training target input/output pad DQx. The controller 10 may transmit a data reference voltage adjustment signal to the memory circuit 20 according to a result of determining a pass or a fail. When data reference voltage training for respective input/output pads DQs is completed, the controller 10 may control data reference voltages for the respective input/output pads DQs, to be reflected on the memory circuit 20.

In an embodiment, the controller 10 may provide a first data reference voltage adjustment signal for training a reference pad, for example DQ1, being any one of a plurality of input/output pads DQs, to the memory circuit 20. Also, the controller 10 may provide a second data reference voltage adjustment signal for training each of remaining input/output pads, for example DQ2 through DQi, to the memory circuit 20.

The memory circuit 20 may include an interface circuit (IF circuit) 30 and a memory region 40. While not illustrated, the memory region 40 may include a memory cell array and various components capable of writing and reading data in and from the memory cell array.

In the data reference voltage training mode, the memory circuit 20 may transmit a training data read result through each input/output pad DQs. The memory circuit 20 may adjust the level of a data reference voltage which is used in reading training data, in response to a data reference voltage adjustment signal provided from the controller 10.

In an embodiment, in data reference voltage training for the reference pad, for example DQ1, being any one of the plurality of input/output pads DQs, the memory circuit 20 may read training data based on a first initial data reference voltage, and may provide a read result to the controller 10 through the reference pad. The memory circuit 20 may generate a reference pad reference voltage by adjusting the level of the first initial data reference voltage in response to the first data reference voltage adjustment signal provided from the controller 10. The memory circuit 20 may read training data based on a second initial data reference voltage being the reference pad reference voltage, and may provide a read result to the controller 10 through each of the remaining input/output pads, for example DQ2 through DQi. The memory circuit 20 may generate a data reference voltage for each of the remaining input/output pads, for example DQ2 through DQi, by adjusting the level of the second initial data reference voltage in response to the second data reference voltage adjustment signal provided from the controller 10.

The memory region 40 may be, but not limited to, a volatile memory apparatus such as a DRAM or a nonvolatile memory apparatus such as a flash memory and a resistive memory.

The components capable of writing and reading data in and from the memory cell array may include an address decoder, a write circuit block and a read circuit block.

The interface circuit 30 may include a clock buffer for converting the clock signal CLK provided from the controller 10 into an internal clock signal, a command buffer for converting the command CMD into an internal command, an address buffer for converting the address ADD into an internal address, and a data buffer for converting the data DATA into internal data.

The interface circuit 30 may buffer the data DATA provided from the controller 10 and provide buffered data to the memory region 40 or transmit the data DATA read from the memory region 40, to the controller 10, according to a request from the controller 10. The data DATA may be transmitted or received through the plurality of input/output pads DQs.

The semiconductor memory apparatus 1 may train a data reference voltage at the predetermined timing, for example, during a booting process.

In an embodiment, the semiconductor memory apparatus 1 may determine any one of the plurality of input/output pads DQs as the reference pad DQ1 and set the reference pad reference voltage by training a data reference voltage for the reference pad DQ1, according to a training command from the controller 10. If the reference pad reference voltage is set, a data reference voltage for each of the remaining input/output pads, DQ2 through DQi, may be set based on the reference pad reference voltage.

In the training mode, the training data DATA provided from the controller 10 may be stored in a preset region of the memory region 40. The controller 10 may set the reference pad reference voltage by training a reference voltage for the reference pad DQ1 being any one of the plurality of input/output pads DQs, according to a training data read result through the reference pad DQ1.

In an embodiment, the controller 10 may determine whether the data read result provided through the reference pad DQ1 from the memory circuit 20 has passed or failed. When the determination result is a pass, for example, the controller 10 may transmit the first data reference voltage adjustment signal to the memory circuit 20 and request the memory circuit 20 to raise or lower the first initial data reference voltage, and the memory circuit 20 may adjust the level of the first initial data reference voltage in response to the control of the controller 10. When the determination result is a fail, for example, the controller 10 may transmit the first data reference voltage adjustment signal to the memory circuit 20 and request the memory circuit 20 to lower or raise the first initial data reference voltage, and the memory circuit 20 may adjust the level of the first initial data reference voltage in response to the control of the controller 10.

The semiconductor memory apparatus 1 may be set with an allowable data reference voltage range. The first initial data reference voltage for determining a pass or a fail for the reference pad DQ1 in the training mode may be the minimum value or the maximum value of the allowable data reference voltage range.

In an embodiment, it may be assumed that the first initial data reference voltage for determining a pass or a fail for the reference pad DQ1 is set as the minimum value of the allowable data reference voltage range.

In this case, when it is determined that an initial read result for the reference pad DQ1 is a pass, the controller 10 requests the memory circuit 20 to raise the first initial data reference voltage. The memory circuit 20 raises the level of the first initial data reference voltage in response to the request from the controller 10, and accordingly, transmits again a read result through the reference pad DQ1. Such a process may be iterated until a read result through the reference pad DQ1 is determined as a fail. A first initial data reference voltage when a read result is determined as a fail may be set as a final reference pad reference voltage.

When it is determined that an initial read result through the reference pad DQ1 is a fail, the controller 10 requests the memory circuit 20 to lower the first initial data reference voltage. The memory circuit 20 lowers the level of the first initial data reference voltage in response to the request from the controller 10, and accordingly, transmits again a read result through the reference pad DQ1. Such a process may be iterated until a read result through the reference pad DQ1 is determined as a pass. A first initial data reference voltage when a read result is determined as a pass may be set as a final reference pad reference voltage.

The first initial data reference voltage for determining whether a data read result through the reference pad DQ1 is a pass or a fail, in the training mode, may be set as the maximum value of the allowable data reference voltage range. In this case, if an initial read result through the reference pad DQ1 is a pass, a process of lowering the first initial data reference voltage is performed, and this process may be iterated until a read result is determined to be a fail. Similarly, if an initial read result through the reference pad is a fail, a process of raising the first initial data reference voltage is performed, and this process may be iterated until a read result is determined to be a pass.

If setting of the reference pad reference voltage is completed, the semiconductor memory apparatus 1 may train a data reference voltage for each of the remaining input/output pads DQ2 through DQi. A data reference voltage training process for each of the remaining input/output pads DQ2 through DQi is substantially the same as the data reference voltage training process for the reference pad DQ1.

It is to be noted that, while the minimum value or the maximum value of the allowable data reference voltage range is used as the first initial data reference voltage in the data reference voltage training for the reference pad DQ1, the reference pad reference voltage is used as the second initial data reference voltage in the data reference voltage training for the remaining input/output pads DQ2 through DQi.

That is to say, whether a read result through each of the input/output pads DQ2 through DQi excluding the reference pad DQ1 is a pass or a fail is determined by setting the reference pad reference voltage as the second initial data reference voltage. A data reference voltage for each of the input/output pads DQs may be set in such a manner that the second initial data reference voltage (the reference pad reference voltage) is raised or lowered in the case of a pass or the second initial data reference voltage (the reference pad reference voltage) is lowered or raised in the case of a fail.

An embodiment, in which the second initial data reference voltage is raised in the case where a read result through each of the remaining input/output pads DQ2 through DQi is a pass and the second initial data reference voltage is lowered in the case where the read result through each of the remaining input/output pads DQ2 through DQi is a fail, may be applied in the case of searching an optimal data reference voltage from the minimum value of the allowable data reference voltage range. An embodiment, in which the second initial data reference voltage is lowered in the case where a read result through each of the remaining input/output pads DQ2 through DQi is a pass and the second initial data reference voltage is raised in the case where the read result through each of the remaining input/output pads DQ2 through DQi is a fail, may be applied in the case of searching an optimal data reference voltage from the maximum value of the allowable data reference voltage range.

Figure 2:
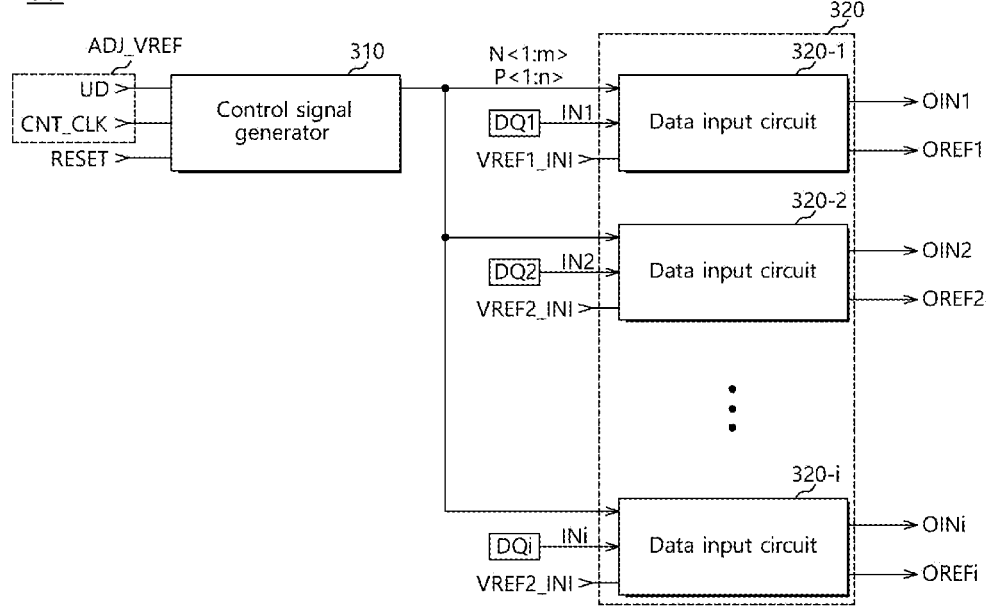
FIG. 2 is a configuration diagram illustrating a representation of an example of an interface circuit in accordance with an embodiment.

FIG. 2 is a configuration diagram illustrating a representation of an example of an interface circuit in accordance with an embodiment.

Referring to FIG. 2, the interface circuit 30 in accordance with an embodiment may include a control signal generator 310 and a data input circuit 320. Each of the data input circuits 320-1 through 320-i in accordance with an embodiment may be electrically coupled to each input/output pad DQs.

The control signal generator 310 may be configured to generate control signals N<1:m> and P<1:n> of plural bits in response to data reference voltage adjustment signals ADJ_VREF (UD and CNT_CLK) and RESET.

Each of the data input circuits 320-1 through 320-i changes the level of an initial data reference voltage VREFx_INI in response to the control signals N<1:m> and P<1:n> of plural bits. Each of the data input circuits 320-1 through 320-i may determine the level of input data INx based on a changed initial data reference voltage VREFx_INI, and provide a determination result OINx to the controller 10. In an embodiment, the initial data reference voltage may comprise a first initial data reference voltage VREF1_INI and a second initial data reference voltage VREF2_INI.

In an embodiment, the control signal generator 310 may count a digital signal in response to the data reference voltage adjustment signals signal ADJ_VREF comprising UD and CNT_CLK, decode a counting result, and generate the control signals N<1:m> and P<1:n>.

The control signal generator 310 may be initialized by a reset signal RESET.

Figure 3:
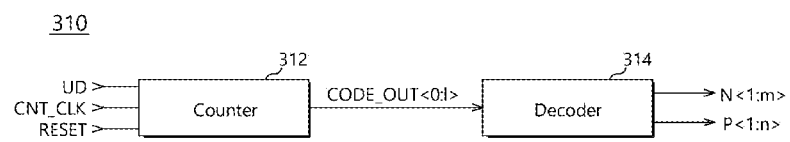
FIG. 3 is a configuration diagram illustrating a representation of an example of a control signal generator in accordance with an embodiment.

For example, as illustrated in FIG. 3, the control signal generator 310 may include a counter 312 and a decoder 314.

The controller 10 may determine whether to raise or lower a reference voltage, based on a read result through a training target input/output pad DQx, and, based thereon, may provide a count signal UD and a count clock CNT_CLK as data reference voltage adjustment signals ADJ_VREF.

The counter 312 may be configured to up-count or down-count a preset initial value in response to the count signal UD and the count clock CNT_CLK, and output count codes CODE_OUT<0:1>.

The decoder 314 may decode the count codes CODE_OUT<0:1> into predetermined numbers of bits, and output m-bit first control signals N<1:m> and n-bit second control signals P<1:n>.

The first control signals N<1:m> and the second control signals P<1:n> may be provided to each of the data input circuits 320-1 through 320-i, and may be used in adjusting the level of the initial data reference voltage VREFx_INI. If a data reference voltage OREFx is determined for each of the input/output pads DQs, the first control signals N<1:m> and the second control signals P<1:n> at that time may be stored in a preset storage region. In an embodiment, the m-bit first control signals N<1:m> and the n-bit second control signals P<1:n> may be stored in a system register. In an embodiment, a fuse block may be cut or programmed to indicate the logic levels of the first control signals N<1:m> and the second control signals P<1:n>.

Figure 4:
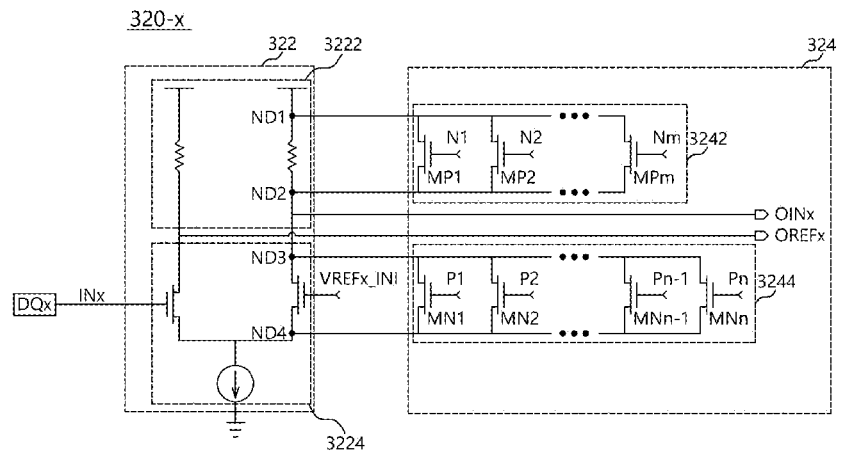
FIG. 4 is a configuration diagram illustrating a representation of an example of a data input circuit in accordance with an embodiment.

FIG. 4 is a configuration diagram illustrating a representation of an example of a data input circuit in accordance with an embodiment.

The data input circuit 320-x in accordance with an embodiment may be electrically coupled to each input/output pad, and may include an amplification unit 322 and a reference voltage adjustment circuit 324.

The amplification unit 322 may be configured to compare input data INx provided through a corresponding input/output pad DQx and an initial data reference voltage VREFx_INI, and generate amplified data OINx and an amplified data reference voltage OREFx. The amplified data OINx is a determination result of a level of the input data INx, and the amplified data reference voltage OREFx is the data reference voltage.

The reference voltage adjustment circuit 324 may be configured to adjust the level of the initial data reference voltage VREFx_INI in response to the control signals N<1:m> and P<1:n>.

In an embodiment, the reference voltage adjustment circuit 324 may include a first adjustment circuit 3242 and a second adjustment circuit 3244.

The first adjustment circuit 3242 may be driven in response to the first control signals N<1:m>.

For example, the first adjustment circuit 3242 may be coupled in parallel to an amplification unit 322 which is coupled to bias supply nodes ND1 and ND2 of a bias supply unit 3222 for amplifying the initial data reference voltage VREFx_INI. The first adjustment circuit 3242 may be configured to include a plurality of switching elements MP1 to MPm which are coupled between a first bias supply node ND1 and a second bias supply node ND2 and are driven by the first control signals N<1:m>. Accordingly, the potential level of the bias supply nodes ND1 and ND2 may vary according to the logic levels of the first control signals N<1:m>.

The second adjustment circuit 3244 may be driven in response to the second control signals P<1:n>.

The second adjustment circuit 3244 may be coupled in parallel to a source section 3224 which is coupled to current sourcing nodes ND3 and ND4 which are driven in response to the initial data reference voltage VREFx_INI. The second adjustment circuit 3244 may be configured to include a plurality of switching elements MN1 to MNn which are coupled between a first sourcing node ND3 and a second sourcing node ND4 and are driven by the second control signals P<1:n>. Accordingly, an amount of current through the current sourcing nodes ND3 and ND4 is controlled according to the logic levels of the second control signals P<1:n>, and as a consequence, it is possible to obtain a result that the level of the initial data reference voltage VREFx_INI is adjusted.

The configuration of the interface circuit 30 illustrated in FIGS. 3 and 4 is for illustration purposes only, and it is to be noted that any configuration may be adopted so long as it is capable of raising or lowering the level of a data reference voltage by a predetermined value according to a data reference voltage adjustment signal provided from the controller 10.

FIG. 5 is a representation of an example of a flow chart to assist in the explanation of a method for training a reference voltage in accordance with an embodiment.

The semiconductor memory apparatus 1 in accordance with an embodiment may determine any one of a plurality of input/output pads as a reference pad and train a data reference voltage for the reference pad in a training mode, and as a result thereof, may set a reference pad reference voltage (S101).

In an embodiment, in the data reference voltage training for the reference pad, the semiconductor memory apparatus 1 may use the minimum value or the maximum value of an allowable data reference voltage range as a first initial data reference voltage.

The data reference voltage for the reference pad, that is, the reference pad reference voltage may be set while raising or lowering the first initial data reference voltage by a predetermined value based on a data read result through the reference pad.

If the reference pad reference voltage is set, for each of remaining input/output pads, a data reference voltage may be set based on a second initial data reference voltage (S103). In an embodiment, the second initial data reference voltage may be set as the reference pad reference voltage.

In an embodiment, in the data reference voltage training for the remaining input/output pads, the semiconductor memory apparatus 1 may use the reference pad reference voltage set in the step S101, as the second initial data reference voltage.

A data reference voltage for each input/output pad may be set while raising or lowering the second initial data reference voltage by a predetermined value based on a data read result through each of the remaining input/output pads.

FIG. 6 is a representation of an example of a flow chart to assist in the explanation of a method for training a reference voltage in accordance with an embodiment.

Data reference voltage training may be performed at a predetermined timing such as booting of the semiconductor memory apparatus 1.

A training process for a reference pad being any one of a plurality of input/output pads and a training process for each of remaining input/output pads are substantially the same, and descriptions will be made below with reference to FIG. 6.

First, the training process for the reference pad will be described.

In order to train a data reference voltage for the reference pad, the memory circuit 20 of the semiconductor memory apparatus 1 may discriminate the level of training data by using a first initial data reference voltage, and transmit a training data read result through the reference pad to the controller 10 (S201).

The controller 10 may determine whether the training data read result through the reference pad is a pass or a fail (S203).

In the case where the determination result of the step S203 is a pass (i.e., Y), the controller 10 may transmit a data reference voltage adjustment signal, for example, a first data reference voltage adjustment signal, to the memory circuit 20 (S205).

The memory circuit 20 may adjust the first initial data reference voltage in response to the first data reference voltage adjustment signal, accordingly read again the training data, and provide a read result to the controller 10 through the reference pad.

The controller 10 may determine whether the training data read result provided again through the reference pad is a pass or a fail (S207). Such a process through the steps S205 and S207 may be iterated until a determination result for the reference pad is changed from a pass to a fail. A first initial data reference voltage when a determination result is changed from a pass to a fail may be set as a final reference pad reference voltage (S209).

In the case where the determination result of the step S203 is a fail (i.e., N), the controller 10 may transmit a first data reference voltage adjustment signal to the memory circuit 20 (S211).

The memory circuit 20 may adjust the first initial data reference voltage in response to the first data reference voltage adjustment signal, and provide a data level re-discrimination result to the controller 10 through the reference pad.

The controller 10 may determine whether the data read result provided again through the reference pad is a pass or a fail (S213). Such a process through the steps S211 and S213 may be iterated until a determination result for the reference pad is changed from a fail to a pass. A first initial data reference voltage when a determination result is changed from a fail to a pass may be set as a final reference pad reference voltage (S215).

In an embodiment, the first initial data reference voltage for the reference pad training may be the minimum value or the maximum value of an allowable data reference voltage range.

In the case where the first initial data reference voltage is the minimum value of the allowable data reference voltage range, the first data reference voltage adjustment signal provided in the step S205 or the step S211 may be a signal which requests that the first initial data reference voltage be raised. According to this fact, the memory circuit 20 may raise the first initial data reference voltage by a predetermined value in response to the first data reference voltage adjustment signal, and provide a read result re-discriminated according to an adjusted first initial data reference voltage, to the controller 10 through the reference pad. The controller 10 may determine whether the read result transmitted again through the reference pad is a pass or a fail, and according to a determination result, may transmit a first data reference voltage adjustment signal or set the first initial data reference voltage at a corresponding time, as the reference pad reference voltage.

In an embodiment, in the case where the first initial data reference voltage used in the reference pad training is the maximum value of the allowable data reference voltage range, the first data reference voltage adjustment signal provided in the step S205 or the step S211 may be a signal which requests that the first initial data reference voltage be lowered. According to this fact, the memory circuit 20 may lower the first initial data reference voltage by a predetermined value in response to the first data reference voltage adjustment signal, and provide a read result re-discriminated according to an adjusted first initial data reference voltage, to the controller 10 through the reference pad. The controller 10 may determine whether the read result transmitted again through the reference pad is a pass or a fail, and according to a determination result, may transmit a first data reference voltage adjustment signal or set the first initial data reference voltage at a corresponding time, as the reference pad reference voltage.

If the reference pad reference voltage is set through the training for the reference pad, data reference voltage training for each of the remaining input/output pads may be performed according to the flow chart illustrated in FIG. 6.

For each of the input/output pads, data reference voltage training may be performed by setting a second initial data reference voltage as the reference pad reference voltage. According to a kind of the first initial data reference voltage (the minimum value or the maximum value of the allowable data reference voltage range) used in the training for the reference pad, the second initial data reference voltage may be raised or lowered in the same manner, in the training for each of the remaining input/output pads.

In other words, if the first initial data reference voltage in the training for the reference pad was the minimum value of the allowable data reference voltage range, the second initial data reference voltage may be raised in the case where determination is made as a pass by the controller 10 in the training for each of the remaining input/output pads, and may be lowered in the case where determination is made as a fail by the controller 10 in the training for each of the remaining input/output pads.

Also, if the first initial data reference voltage in the training for the reference pad was the maximum value of the allowable data reference voltage range, the second initial data reference voltage may be lowered in the case where determination is made as a pass by the controller 10 in the training for each of the remaining input/output pads, and may be raised in the case where determination is made as a fail by the controller 10 in the training for each of the remaining input/output pads.

If the training of a data reference voltage for each of the reference pad and the remaining input/output pads is completed through such a process, the control signals $N<1:m>$ and $P<1:n>$ at a corresponding time may be stored in a preset region. In an operation of the semiconductor memory apparatus 1, the interface circuit 30 may determine the logic level of data by adjusting a reference voltage to a preset value corresponding to the control signals $N<1:m>$ and $P<1:n>$ for each input/output pad.

The control signals $N<1:m>$ and $P<1:n>$ may be stored, but not limited to, in a system register of the semiconductor memory apparatus 1 or through fuse cutting or programming.

Figure 7:
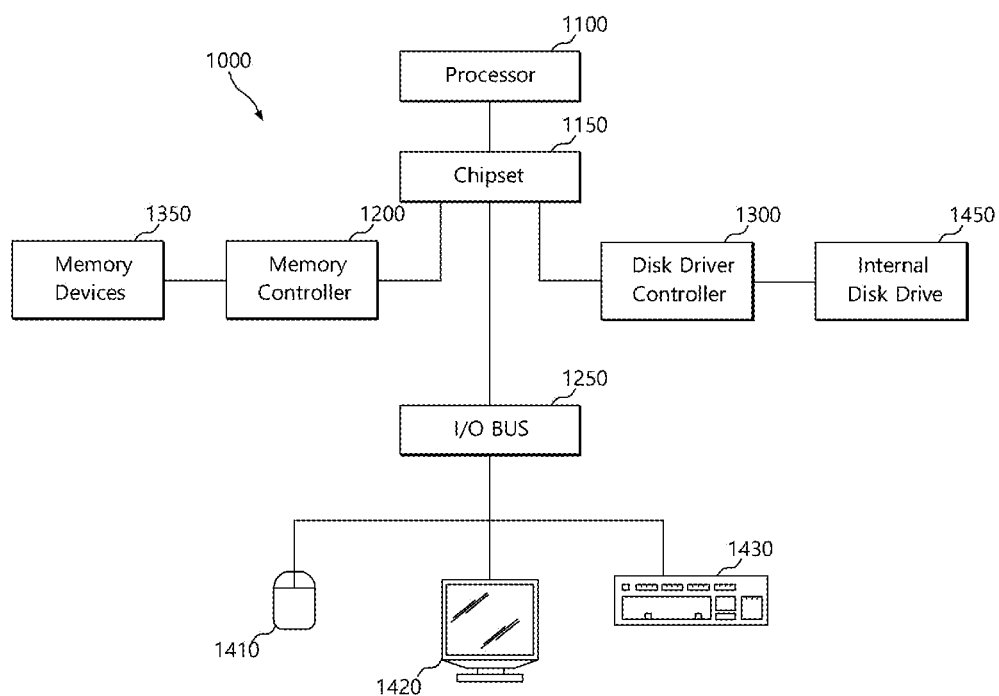
FIG. 7 illustrates a block diagram of an example of a representation of a system employing a semiconductor apparatus and/or method for training a reference voltage in accordance with the various embodiments discussed above with relation to FIGS. 1-6.

The semiconductor apparatus and method for training a reference voltage discussed above (see FIGS. 1-6) are particular useful in the design of memory devices, processors, and computer systems. For example, referring to FIG. 7, a block diagram of a system employing a semiconductor apparatus and/or method for training a reference voltage in accordance with the various embodiments are illustrated and generally designated by a reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor apparatus and/or method for training a reference voltage as discussed above with reference to FIGS. 1-6. Thus, the memory controller 1200 can receive a request provided from the processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus and/or method for training a reference voltage as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor apparatus and/or method for training a reference voltage as discussed above with relation to FIGS. 1-6. In alternate embodiments, such as, for example but not limited to, cellular phones or digital cameras, the components may differ from the embodiments illustrated in FIG. 7.

While various embodiments have been described above, it will be understood to those skilled in the art that the embodiments described are examples only. Accordingly, the semiconductor memory apparatus and the method for training a reference voltage described herein should not be limited based on the described embodiments.

What is claimed is:

1. A semiconductor memory apparatus configured to, in a data reference voltage training mode, set a reference pad reference voltage by training a first initial data reference voltage for a reference pad being any one of a plurality of input/output pads, and set a data reference voltage for each of remaining input/output pads by training a second initial data reference voltage being the reference pad reference voltage for each of the remaining input/output pads, wherein the reference pad reference voltage is generated by raising or lowering the first initial data reference voltage for determining a data read result provided through the reference pad.

2. The semiconductor memory apparatus according to claim 1, wherein the first initial data reference voltage is configured to be selected between a minimum value and a maximum value of an allowable data reference voltage range.

3. The semiconductor memory apparatus according to claim 1, configured to raise or lower the second initial data reference voltage by determining a data read result provided through each of the remaining input/output pads.

4. The semiconductor memory apparatus according to claim 1, configured to raise or lower the first initial data reference voltage by initially determining a read result of training data based on the first initial data reference voltage, redetermine a read result of the training data based on the raised or lowered first initial data reference voltage, and set the first initial data reference voltage when a redetermination result different from an initial determination result is acquired, as the reference pad reference voltage.

5. The semiconductor memory apparatus according to claim 4, configured to redetermine a read result by raising or lowering the first initial data reference voltage, until a redetermination result different from the initial determination result is acquired.

6. The semiconductor memory apparatus according to claim 1, configured to, for each of the remaining input/output pads, raise or lower the second initial data reference voltage by initially determining a read result of training data based on the second initial data reference voltage, redetermine a read result of the training data based on the raised or lowered second initial data reference voltage, and set the second initial data reference voltage when a redetermination result different from an initial determination result is acquired, as the data reference voltage of each of the remaining input/output pads.

7. The semiconductor memory apparatus according to claim 6, configured to redetermine a read result by raising or lowering the second initial data reference voltage, until a redetermination result different from the initial determination result is acquired.

8. A semiconductor memory apparatus comprising:
a controller configured to, in a training mode, generate a first data reference voltage adjustment signal for training a reference voltage for a reference pad being any one of a plurality of input/output pads, and generate a second data reference voltage adjustment signal for training a reference voltage for each of remaining input/output pads; and
a memory circuit configured to generate a reference pad reference voltage by changing a first initial data reference voltage in response to the first data reference voltage adjustment signal, and generate a data reference voltage for each of the remaining input/output pads by changing a second initial data reference voltage being the reference pad reference voltage in response to the second data reference voltage adjustment signal,
wherein the controller is configured to raise or lower the first initial data reference voltage by determining a data read result provided through the reference pad and configured to raise or lower the second initial data reference voltage by determining a data read result provided through each of the remaining input/output pads.

9. The semiconductor memory apparatus according to claim 8, wherein the first initial data reference voltage is configured to be selected between a minimum value and a maximum value of an allowable data reference voltage range.

10. The semiconductor memory apparatus according to claim 8, wherein the memory circuit includes a control signal generator configured to generate a control signal for changing a level of the first initial data reference voltage in response to the first data reference voltage adjustment signal.

11. The semiconductor memory apparatus according to claim 8, wherein the memory circuit includes a control signal generator configured to generate a control signal for changing a level of the second initial data reference voltage in response to the second data reference voltage adjustment signal.

12. The semiconductor memory apparatus according to claim 8, wherein the first data reference voltage adjustment signal comprises a signal which causes the first initial data reference voltage to be raised or lowered, and the second data reference voltage adjustment signal comprises a signal which causes the second initial data reference voltage to be raised or lowered.

13. The semiconductor memory apparatus according to claim 12,
wherein the controller generates the first data reference voltage adjustment signal by initially determining a read result of training data based on the first initial data reference voltage, and the memory circuit raises or lowers the first initial data reference voltage in response to the first data reference voltage adjustment signal, and
wherein the controller redetermines a read result of the training data based on the raised or lowered first initial data reference voltage, and sets the first initial data reference voltage when a redetermination result different from an initial determination result is acquired, as the reference pad reference voltage.

14. The semiconductor memory apparatus according to claim 13, wherein the controller is configured to redetermine a read result by raising or lowering the first initial data reference voltage, until a redetermination result different from the initial determination result is acquired.

15. The semiconductor memory apparatus according to claim 12,
wherein the controller generates the second data reference voltage adjustment signal by initially determining a read result of training data based on the second initial data reference voltage, for each of the remaining input/output pads, and the memory circuit raises or lowers the second initial data reference voltage in response to the second data reference voltage adjustment signal, and
wherein the controller redetermines a read result of the training data based on the raised or lowered second initial data reference voltage, and sets the second initial data reference voltage when a redetermination result different from an initial determination result is acquired, as the data reference voltage for each of the remaining input/output pads.

16. The semiconductor memory apparatus according to claim 15, wherein the controller is configured to redetermine a read result by raising or lowering the second initial data reference voltage, until a redetermination result different from the initial determination result is acquired.

17. A semiconductor memory apparatus comprising:
a controller configured to raise or lower a reference voltage based on a read result through a training target input/output pad, and provide a count signal and a count clock as data reference voltage adjustment signals;
an interface circuit coupled to the controller, the interface circuit comprising:
a control signal generator configured to generate control signals in response to the data reference voltage adjustment signals; and
a data input circuit configured to change a level of a data reference voltage in response to the control signals, determine a level of input data based on a changed data reference voltage, and provide a determination result,
wherein the interface circuit includes a counter configured to up-count or down-count a preset initial value in response to the count signal and the count clock and output count codes for raising or lowering the reference voltage.

18. The semiconductor memory apparatus according to claim 17, wherein the interface circuit includes a decoder configured to decode the count codes and output first and second control signals.

19. The semiconductor memory apparatus according to claim 18, wherein the data input circuit is configured to change the level of the data reference voltage according to the first and second control signals received from the decoder.

20. The semiconductor memory apparatus according to claim 19, further comprising:
a storage region coupled to the interface circuit and configured to store the first and second control signals if the data reference voltage is determined for an input/output pad.

* * * * *